US006455442B1

(12) United States Patent
Bauer et al.

(10) Patent No.: US 6,455,442 B1
(45) Date of Patent: Sep. 24, 2002

(54) PROCESS FOR THE PREPARATION OF UV PROTECTIVE COATINGS BY PLASMA-ENHANCED DEPOSITION

(75) Inventors: Michael Bauer, Wittnau (DE); Werner Kaufmann, Brookfield, CT (US); Gerhard Rytz, Neuchâtel (CH)

(73) Assignee: Ciba Specialty Chemicals Corporation, Tarrytown, NY (US)

( * ) Notice: Subject to any disclaimer, the term of this patent is extended or adjusted under 35 U.S.C. 154(b) by 0 days.

(21) Appl. No.: 09/674,332

(22) PCT Filed: Apr. 15, 1999

(86) PCT No.: PCT/EP99/02536

§ 371 (c)(1), (2), (4) Date: Jan. 2, 2001

(87) PCT Pub. No.: WO99/55471

PCT Pub. Date: Nov. 4, 1999

(30) Foreign Application Priority Data

Apr. 27, 1998 (CH) ............................................. 947/98

(51) Int. Cl.$^{7}$ ....................... H01L 21/31; H01L 21/469; H01L 21/44

(52) U.S. Cl. ....................... 438/780; 438/781; 438/680; 438/681; 427/489; 427/569; 427/412.1

(58) Field of Search ................................ 438/680, 780, 438/781, 798, 681; 427/489, 569, 412.1

(56) References Cited

U.S. PATENT DOCUMENTS

| | | | | |
|---|---|---|---|---|
| 5,156,882 A | * | 10/1992 | Rzad et al. | 427/489 |
| 5,322,868 A | * | 6/1994 | Valet | 524/89 |
| 5,856,380 A | | 1/1999 | Bauer et al. | 523/300 |

FOREIGN PATENT DOCUMENTS

| | | | |
|---|---|---|---|
| DE | 19522865 | | 1/1997 |
| DE | 19522865 | * | 2/1997 |
| EP | 0442847 | | 8/1991 |
| WO | 96/28431 | | 9/1996 |
| WO | 97/22631 | | 6/1997 |

OTHER PUBLICATIONS

Derwent Abstract 94–072039 for JP 06025448 1994 No month.

* cited by examiner

*Primary Examiner*—Alexander G. Ghyka
(74) *Attorney, Agent, or Firm*—Tyler A. Stevenson

(57) ABSTRACT

This invention relates to a process for the preparation of UV protective coatings by plasma-enhanced vacuum deposition, using hydroxyphenyl-s-triazines as UV absorbers. This invention also relates to the use of hydroxyphenyl-s-triazines in plasma-enhanced vacuum depositions and to the substrates coated by this process.

13 Claims, No Drawings

PROCESS FOR THE PREPARATION OF UV PROTECTIVE COATINGS BY PLASMA-ENHANCED DEPOSITION

The present invention relates to a process for the preparation of UV protective coatings via plasma-enhanced vacuum deposition, which process comprises using hydroxyphenyl-s-triazines as UV absorbers. This invention also relates to the use of hydroxyphenyl-s-triazines in plasma-enhanced vacuum depositions and to the substrates coated by this process.

The generation of low-temperature plasmas and plasma-enhanced deposition of thin organic or inorganic coatings have been known for some time and have been described, inter alia, by A. T. Bell, "Fundamentals of Plasma Chemistry" in "Technology and Application of Plasma Chemistry", edited by J. R. Holahan and A. T. Bell, Wiley, N.Y. (1974), and by H. Suhr, Plasma Chem. Plasma Process 3(1),1, (1983).

Such coatings can often be used to specifically change substrate properties. In particular, these processes can bring about surface changes without altering, or even impairing, the other properties of the material very much.

EP-A-0 734 400 describes, for example, the deposition of phosphorus-containing compounds for achieving flame-retarding properties of fibers and fabrics.

U.S. Pat. No. 5,156,882 describes the plasma-enhanced deposition of UV absorbant layers consisting of $TiO_2$ or other transition metal oxides. One problem in the case of the deposition of inorganic oxides is that the adhesion achieved on polymer substrates is usually only insufficient, thus making it necessary to build up additional intermediate layers of e.g. $SiO_2$. The UV absorbant inorganic layers are usually not fully transparent in the visible range which is disadvantageous for many applications.

Attempts have therefore also been made to obtain UV absorbant coatings by depositing purely organic compounds via plasma processes. DE 195 22 865 describes, for example, a PECVD process ("plasma enhanced chemical vapour deposition") for the preparation of UV absorbant coatings using compounds containing a structural element of formula (A)

(A)

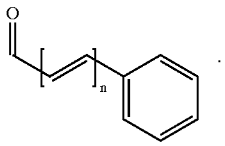

JP 6-25448, published on Feb. 1st, 1994, describes a process for the plasma polymerisation of known UV absorbers, such as phenylsalicylates, 2-hydroxybenzophenones, hydroxyphenylbenzotriazoles and cyanoacrylates, on plastic materials.

The plasma-enhanced deposition of organic compounds often results in unpredictable changes of the molecular structures. This is often the case when functional groups, for example OH groups, are present in the molecule. These groups can either be oxidised or deposited. The deposited film can therefore have absorption properties completely different from those of the original compound. Apart from the absorption properties, the photochemical resistance of the deposited compound in the film can also be different from that of the original compound, so that the long-term protection of the deposited film can deviate substantially from that which one would expect when using the original compound in a conventional coating.

Surprisingly, it has now been found that the UV absorber class of the hydroxyphenyl-s-triazines is very particularly suitable for the preparation of UV absorbant layers by plasma-enhanced deposition.

The absorption spectra of the deposited compounds show only a minor change as compared to the spectra in solution, indicating good retention of the molecular structure. They can be evaporated in a wide temperature range without degradation and form, under the conditions of plasma deposition, clear transparent coatings. In combination with a mono- or polyolefinically unsaturated monomer, which is evaporated concomitantly, it is possible to prepare highly adhesive coatings on polymeric substrates.

Because of their good evaporability—without degradation even at higher temperatures—it is also possible to concomitantly evaporate higher molecular weight chromophoric substances such as pigments or dyes and thus to prepare highly UV absorbant coloured coatings.

It is also possible to first deposit the UV absorbers and then to deposit thereon a plasma-enhanced scratch resistant layer of $SiO_2$.

In another of its aspects, this invention relates to a process for the preparation of a continuous UV absorbant layer on organic or inorganic substrates via plasma-enhanced vacuum deposition, which comprises evaporating a UV absorber of the hydroxyphenyl-s-triazine class under vacuum while exposing it to a plasma and allowing it to deposit on the substrate.

Preferred substrates are metals, semiconductors, glass, quartz or thermoplastic crosslinked or structurally crosslinked plastic materials.

A semiconductor substrate to be mentioned in particular is silicium which can be present, for example, in the form of wavers.

Metals to be mentioned are in particular aluminium, chromium, steel, vanadium, which are used for manufacturing high quality mirrors such as telescope mirrors or automobile headlight mirrors. Aluminium is particularly preferred.

Examples of thermoplastic crosslinked or structurally crosslinked plastic materials are listed below.

1. Polymers of monoolefins and diolefins, for example polypropylene, polyisobutylene, polybut-1-ene, poly-4-methylpent-1-ene, polyisoprene or polybutadiene, as well as polymers of cycloolefins, for instance of cyclopentene or norbornene, polyethylene (which optionally can be crosslinked), for example high density polyethylene (HDPE), high density and high molecular weight polyethylene (HDPE-HMW), high density and ultrahigh molecular weight polyethylene (HDPE-UHMW), medium density polyethylene (MDPE), low density polyethylene (LDPE), linear low density polyethylene (LLDPE), (VLDPE) and (ULDPE).

Polyolefins, i.e. the polymers of monoolefins exemplified in the preceding paragraph, preferably polyethylene and polypropylene, can be prepared by different, and especially by the following, methods:

a) radical polymerisation (normally under high pressure and at elevated temperature).

b) catalytic polymerisation using a catalyst that normally contains one or more than one metal of groups IVb, Vb, VIb or VIII of the Periodic Table. These metals usually have one or more than one ligand, typically oxides, halides, alcoholates, esters, ethers, amines, alkyls, alkenyls and/or aryls that may be either π- or σ-coordinated. These metal complexes may be in the free form or fixed on substrates, typically on activated magnesium chloride, titanium(III) chloride, alumina or silicon oxide. These catalysts may be soluble or insoluble in the polymerisation medium. The catalysts can be used by themselves in the polymerisation or further activators may be used, typically metal alkyls, metal hydrides, metal alkyl halides, metal alkyl oxides or metal alkyloxanes, said metals being elements of groups Ia, IIa and/or IIIa of the Periodic Table. The activators may be modified conveniently with further ester, ether, amine or silyl ether groups. These catalyst systems are usually termed Phillips, Standard Oil Indiana, Ziegler (-Natta), TNZ (DuPont), metallocene or single site catalysts (SSC).

2. Mixtures of the polymers mentioned under 1), for example mixtures of polypropylene with polyisobutylene, polypropylene with polyethylene (for example PP/HDPE, PP/LDPE) and mixtures of different types of polyethylene (for example LDPE/HDPE).

3. Copolymers of monoolefins and diolefins with each other or with other vinyl monomers, for example ethylene/propylene copolymers, linear low density polyethylene (LLDPE) and mixtures thereof with low density polyethylene (LDPE), propylene/but-1-ene copolymers, propylene/isobutylene copolymers, ethylene/but-1-ene copolymers, ethylene/hexene copolymers, ethylene/methylpentene copolymers, ethylene/heptene copolymers, ethylene/octene copolymers, propylene/butadiene copolymers, isobutylene/isoprene copolymers, ethylene/alkyl acrylate copolymers, ethylene/alkyl methacrylate copolymers, ethylenetvinyl acetate copolymers and their copolymers with carbon monoxide or ethylene/acrylic acid copolymers and their salts (ionomers) as well as terpolymers of ethylene with propylene and a diene such as hexadiene, dicyclopentadiene or ethylidene-norbornene; and mixtures of such copolymers with one another and with polymers mentioned in 1) above, for example polypropylene/ethylene-propylene copolymers, LDPE/ethylene-vinyl acetate copolymers (EVA), LDPE/ethylene-acrylic acid copolymers (EAA), LLDPE/EVA, LLDPE/EAA and alternating or random polyalkylene/carbon monoxide copolymers and mixtures thereof with other polymers, for example polyamides.

4. Hydrocarbon resins (for example $C_5$–$C_9$) including hydrogenated modifications thereof (e.g. tackifiers) and mixtures of polyalkylenes and starch.

5. Polystyrene, poly(p-methylstyrene), poly((α-methylstyrene).

6. Copolymers of styrene or α-methylstyrene with dienes or acrylic derivatives, for example styrene/butadiene, styrene/acrylonitrile, styrene/alkyl methacrylate, styrene/butadiene/alkyl acrylate, styrene/styrene/butadiene/alkyl methacrylate, styrene/maleic anhydride, styrene/acrylonitrile/methyl acrylate: mixtures of high impact strength of styrene copolymers and another polymer, for example a polyacrylate, a diene polymer or an ethylene/propylene/diene terpolymer; and block copolymers of styrene such as styrene/butadiene/styrene, styrene/isoprene/styrene, styrene/ethylene/butylene/styrene or styrene/ethylene/propylene/styrene.

7. Graft copolymers of styrene or α-methylstyrene, for example styrene on polybutadiene, styrene on polybutadiene-styrene or polybutadiene-acrylonitrile copolymers; styrene and acrylonitrile (or methacrylonitrile) on polybutadiene; styrene, acrylonitrile and methyl methacrylate on polybutadiene; styrene and maleic anhydride on polybutadiene; styrene, acrylonitrile and maleic anhydride or maleimide on polybutadiene; styrene and maleimide on polybutadiene; styrene and alkyl acrylates or methacrylates on polybutadiene; styrene and acrylonitrile on ethylene/propylene/diene terpolymers; styrene and acrylonitrile on polyalkyl acrylates or polyalkyl methacrylates, styrene and acrylonitrile on acrylatelbutadiene copolymers, as well as mixtures thereof with the copolymers listed under 6), for example the copolymer mixtures known as ABS, MBS, ASA or AES polymers.

8. Halogen-containing polymers such as polychloroprene, chlorinated rubbers, chlorinated and brominated copolymer of isobutylene-isoprene (halobutyl rubber), chlorinated or sulfochlorinated polyethylene, copolymers of ethylene and chlorinated ethylene, epichlorohydrin homo- and copolymers, especially polymers of halogen-containing vinyl compounds, for example polyvinyl chloride, polyvinylidene chloride, polyvinyl fluoride, polyvinylidene fluoride, as well as copolymers thereof such as vinyl chloride/vinylidene chloride, vinyl chloridehinyl acetate or vinylidene chloride/vinyl acetate copolymers.

9. Polymers derived from α,β-unsaturated acids and derivatives thereof such as polyacrylates and polymethacrylates; polymethyl methacrylates, polyacrylamides and polyacrylonitriles, impact-modified with butyl acrylate.

10. Copolymers of the monomers mentioned under 9) with each other or with other unsaturated monomers, for example acrylonitrile/ butadiene copolymers, acrylonitrile/alkyl acrylate copolymers, acrylonitrile/alkoxyalkyl acrylate or acrylonitrile/vinyl halide copolymers or acrylonitrile/alkyl methacrylate/butadiene terpolymers.

11. Polymers derived from unsaturated alcohols and amines or the acyl derivatives or acetals thereof, for example polyvinyl alcohol, polyvinyl acetate, polyvinyl stearate, polyvinyl benzoate, polyvinyl maleate, polyvinyl butyral, polyallyl phthalate or polyallyl melamine; as well as their copolymers with olefins mentioned in 1) above.

12. Homopolymers and copolymers of cyclic ethers such as polyalkylene glycols, polyethylene oxide, polypropylene oxide or copolymers thereof with bisglycidyl ethers.

13. Polyacetals such as polyoxymethylene and those polyoxymethylenes which contain ethylene oxide as a comonomer; polyacetals modified with thermoplastic polyurethanes, acrylates or MBS.

14. Polyphenylene oxides and sulfides, and mixtures of polyphenylene oxides with styrene polymers or polyamides.

15. Polyurethanes derived from hydroxyl-terminated polyethers, polyesters or polybutadienes on the one hand and aliphatic or aromatic polyisocyanates on the other, as well as precursors thereof.

16. Polyamides and copolyamides derived from diamines and dicarboxylic acids and/or from aminocarboxylic acids or the corresponding lactams, for example polyamide 4, polyamide 6, polyamide 6/6, 6/10, 6/9, 6/12, 4/6, 12/12, polyamide 11, polyamide 12, aromatic polyamides starting from m-xylene diamine and adipic acid; polyamides prepared from hexamethylenediamine and isophthalic or/and terephthalic acid and with or without an elastomer as modifier, for example poly-2,4,4,-trimethylhexamethylene terephthalamide or poly-m-phenylene isophthalamide; and also block copolymers of the aforementioned polyamides with polyolefins, olefin copolymers, ionomers or chemically bonded or grafted elastomers; or with polyethers, e.g. with polyethylene glycol, polypropylene glycol or polytetramethylene glycol; as well as polyamides or copolyamides modified with EPDM or ABS; and polyamides condensed during processing (RIM polyamide systems).

17. Polyureas, polyimides, polyamide-imides, polyetherimids, polyesterimids, polyhydantoins and polybenzimidazoles.

18. Polyesters derived from dicarboxylic acids and diols and/or from hydroxycarboxylic acids or the corresponding lactones, for example polyethylene terephthalate, polybutylene terephthalate, poly-1,4-dimethylolcyclohexane terephthalate and polyhydroxybenzoates, as well as block copolyether esters derived from hydroxyl-terminated polyethers; and also polyesters modified with polycarbonates or MBS.

19. Polycarbonates and polyester carbonates.

20. Polysulfones, polyether sulfones and polyether ketones.

21. Crosslinked polymers derived from aldehydes on the one hand and phenols, ureas and melamines on the other hand, such as phenol/formaldehyde resins, urea/formaldehyde resins and melamine/formaldehyde resins.

22. Drying and non-drying alkyd resins.

23. Unsaturated polyester resins derived from copolyesters of saturated and unsaturated dicarboxylic acids with polyhydric alcohols and vinyl compounds as crosslinking agents, and also halogen-containing modifications thereof of low flammability.

24. Crosslinkable acrylic resins derived from substituted acrylates, for example epoxy acrylates, urethane acrylates or polyester acrylates.

25. Alkyd resins, polyester resins and acusate resins crosslinked with melamine resins, urea resins, isocyanates, isocyanurates, polyisocyanates or epoxy resins.

26. Crosslinked epoxy resins derived from aliphatic, cycloaliphatic, heterocyclic or aromatic glycidyl compounds, e.g. products of diglycidyl ethers of bisphenol A and bisphenol F, which are crosslinked with customary hardeners such as anhydrides or amines, with or without accelerators.

27. Natural polymers such as cellulose, rubber, gelatin and chemically modified homologous derivatives thereof, for example cellulose acetates, cellulose propionates and cellulose butyrates, or the cellulose ethers such as methyl cellulose; as well as rosins and their derivatives.

28. Blends of the aforementioned polymers (polyblends), for example PP/EPDM, Polyamide/EPDM or ABS, PVC/EVA, PVC/ABS, PVC/MBS, PC/ABS, PBTP/ABS, PC/ASA, PC/PBT, PVC/CPE, PVC/acrylates, POM/thermoplastic PUR, PC/thermoplastic PUR, POM/acrylate, POM/MBS, PPO/HIPS, PPO/PA 6.6 and copolymers, PA/HDPE, PA/PP, PANPPO, PBT/PC/ABS or PBT/PET/PC.

The thermoplastic, crosslinked or structurally crosslinked plastic material is preferably polyolefin, polyamide, polyacrylate, polycarbonate, polystyrene or an acryl/melamine, alkyd or polyurethane paint system.

Polycarbonate is particularly preferred.

The plastic materials can be in the form of films, moulded articles, extrusion production parts, fibers, felts or fabrics. It is possible to provide not only building components for the automotive industry but also object s such as spectacles or con tact lenses with a thin UV absorbant layer.

The UV absorbers of the hydroxyphenyl-s-triazine class preferably have a molecular weight of less than 1000.

Preferred UV absorbers of the hydroxyphenyl-s-triazine class are compounds of formula I or II (I)

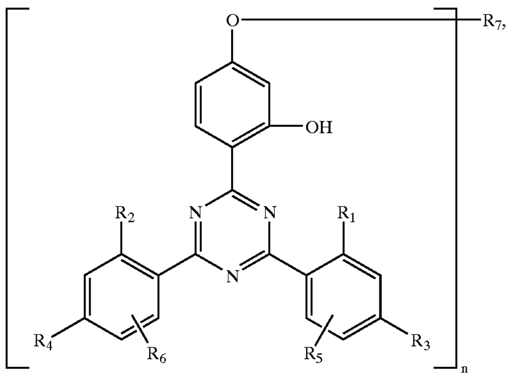

(II)

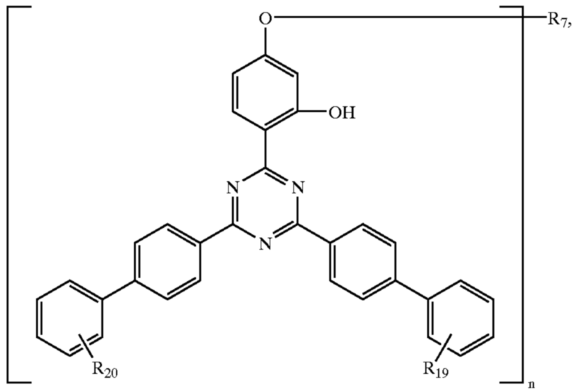

wherein n is 1 or 2, $R_1$ and $R_2$ are each independently of the other H, OH, $C_1$–$C_{12}$alkyl or halomethyl, $R_3$ and $R_4$ are each independently of the other H, OH, $C_1$–$C_{12}$alkyl, $C_1$–$C_{18}$alkoxy or halogen and, in the case of n=1, can also be a radical —$OR_7$, $R_5$ and $R_6$ are each independently of the other H, $C_1$–$C_{12}$alkyl or halogen, $R_7$, if n is 1, is hydrogen, $C_1$–$C_{18}$alkyl, or $C_1$–$C_{12}$alkyl which is substituted by OH, $C_1$–$C_{18}$alkoxy, halogen, phenoxy, or by phenoxy which is substituted by $C_1$–$C_{18}$alkyl, $C_1$–$C_{18}$alkoxy or halogen; or by —COOH, —$COOR_8$, —$CONH_2$, —$CONHR_9$, —$CON(R_9)(R_{10})$, —$NH_2$, —$NHR_9$, —$N(R_9)(R_{10})$, —$NHCOR_{11}$, —CN and/or —$OCOR_{11}$, or $R_7$ is $C_4$–$C_{20}$alkyl, $C_3$–$C_6$alkenyl, glycidyl, $C_5$–$C_8$cycloalky, each of which is interrupted by one or several O and substituted by OH or $C_1$–$C_{12}$alkoxy; cyclohexyl which is substituted by OH, $C_1$–$C_4$alkyl or —$OCOR_{11}$; $C_7$–$C_{11}$phenylalkyl, —CO—$R_{12}$ or —$SO_2$—$R_{13}$, each of which is unsubstituted or substituted by OH, Cl or $CH_3$ and, if n is 2, is $C_2$–$C_{16}$alkylene, $C_4$–$C_{12}$alkenylene, xylylene; $C_3$–$C_{20}$alkylene which is interrupted by one or several O and/or substituted by OH; a group —$CH_2CH(OH)CH_2O$—$R_{15}$—$OCH_2CH(OH)CH_2$—, —CO—$R_{16}$—CO—, —CO—NH—$R_{17}$—NH—CO— or —$(CH_2)_m$—COO—$R_{18}$—OCO—$(CH_2)_m$—, wherein m is 1–3, $R_8$ is $C_1$–$C_{18}$alkyl, $C_3$–$C_{18}$alkenyl; $C_3$–$C_{20}$alkyl which is interrupted by O, N or S and/or substituted by OH; $C_1$–$C_4$alkyl, glycidyl, cyclohexyl or $C_7$–$C_{11}$phenylalkyl, each of which is substituted by —$P(O)(OR_{14})_2$, —$N(R_9)(R_{10})$ or —$OCOR_{11}$, and/or OH, $R_9$ and $R_{10}$ are each independently of the other $C_1$–$C_{12}$alkyl, $C_3$–$C_{12}$alkoxyalkyl, $C_4$–$C_{16}$dialkylaminoalkyl or $C_5$–$C_{12}$cycloalkyl, or $R_9$ and $R_{10}$ together are $C_3$–$C_9$alkylene or $C_3$–$C_9$oxaalkylene or $C_3$–$C_9$azaalkylene, $R_{11}$ is $C_1$–$C_{18}$alkyl, $C_2$–$C_{18}$alkenyl or phenyl, $R_{12}$ is $C_1$–$C_{18}$alkyl, $C_2$–$C_{18}$alkenyl, phenyl, $C_1$–$C_{12}$alkoxy, phenoxy, $C_1$–$C_{12}$alkylamino, phenylamino, tolylamino or naphthylamino, $R_{13}$ is $C_1$–$C_{12}$alkyl, phenyl, naphthyl or $C_7$–$C_{14}$alkylphenyl, $R_{14}$ is $C_1$–$C_{12}$alkyl or phenyl, $R_{15}$ is $C_2$–$C_{10}$alkylene, phenylene or a group -phenylene-X-phenylene-, wherein X is —O—, —S—, —$SO_2$—, —$CH_2$— or —$C(CH_3)_2$—, $R_{16}$ is $C_2$–$C_{10}$alkylene, $C_2$–$C_{10}$oxaalkylene or $C_2$–$C_{10}$thiaalkylene, phenylene, naphthylene, diphenylene or $C_2$–$C_6$alkenylene, $R_{17}$ is $C_2$–$C_{10}$alkylene, phenylene, naphthylene, methylenediphenylene or $C_7$–$C_{15}$alkylphenylene, $R_{18}$ is $C_2$–$C_{10}$alkylene or $C_4$–$C_{20}$alkylene which is interrupted by O, and $R_{19}$ and $R_{20}$ are each independently of the other H, OH, $C_1$–$C_{12}$alkyl, $C_1$–$C_{12}$alkoxy, $NH_2$, $NHR_9$, $NR_9R_{10}$ or halogen.

Halogen is chloro, bromo or iodo. Chloro is preferred. Alkyl containing up to 18 carbon atoms is a branched or unbranched radical, for example methyl, ethyl, propyl, isopropyl, n-butyl, sec-butyl, isobutyl, tert-butyl, 2-ethylbutyl, n-pentyl, isopentyl, 1-methylpentyl, 1,3-dimethylbutyl, n-hexyl, 1-methylhexyl, n-heptyl, isoheptyl, 1,1,3,3-tetramethylbutyl, 1-methylheptyl, 3-methylheptyl, n-octyl, 2-ethylhexyl, 1,1,3-trimethylhexyl, 1,1,3,3-tetramethylpentyl, nonyl, decyl, undecyl, 1-methylundecyl, dodecyl, 1,1,3,3,5,5-hexamethylhexyl, tridecyl, tetradecyl, pentadecyl, hexadecyl, heptadecyl or octadecyl.

Alkenyl containing 3 to 18 carbon atoms is a branched or unbranched radical, for example propenyl, 2-butenyl, 3-butenyl, isobutenyl, n-2,4-pentadienyl, 3-methyl-2-butenyl, n-2-octenyl, n-2-dodecenyl, isododecenyl, oleyl, n-2-octadecenyl or n-4-octadecenyl.

$C_7$–$C_9$Phenylalkyl is, for example, benzyl, α-methylbenzyl, α,α-dimethylbenzyl or 2-phenylethyl. Benzyl and α,α-dimethylbenzyl are preferred.

Unsubstituted or $C_1$–$C_4$alkyl-substituted $C_5$–$C_8$cycloalkyl is, for example, cyclopentyl, methylcyclopentyl, dimethylcyclopentyl, cyclohexyl, methylcyclohexyl, dimethylcyclohexyl, trimethylcyclohexyl, tert-butylcyclohexyl, cycloheptyl or cyclooctyl.

Alkoxy containing up to 18 carbon atoms is a branched or unbranched radical, for example methoxy, ethoxy, propoxy, isopropoxy, n-butoxy, isobutoxy, pentoxy, isopentoxy, hexoxy, heptoxy, octoxy, decyloxy, tetradecyloxy, hexadecyloxy or octadecyloxy.

$C_1$–$C_{18}$Alkylene is a branched or unbranched radical, for example methylene, ethylene, propylene, trimethylene, tetramethylene, pentamethylene, hexamethylene, heptamethylene, octamethylene, decamethylene, dodecamethylene or octadecamethylene.

A preferred subgroup of the compounds of formula I or II is that, wherein n is 1 or 2, $R_1$ and $R_2$ are each independently of the other H, OH or $C_1$–$C_4$alkyl, $R_3$ and $R_4$ are each independently of the other H, OH, $C_1$–$C_4$alkyl, $C_1$–$C_4$alkoxy, halogen or a radical —$OR_7$, $R_5$ and $R_6$ are each independently of the other H or $C_1$–$C_4$alkyl, $R_7$, if n is 1, is hydrogen, $C_1$–$C_{18}$alkyl; $C_1$–$C_6$alkyl, allyl, glycidyl or benzyl, each of which is substituted by OH, $C_1$–$C_{18}$alkoxy, phenoxy, —$COOR_8$, —$CONHR_9$, —$CON(R_9)(R_{10})$ and/or —$OCOR_{11}$ and, if n is 2, is $C_4$–$C_{12}$alkylene, $C_4$–$C_6$alkenylene, xylylene, or $C_3$–$C_{20}$alkylene which is interrupted by one or several O and/or substituted by OH, $R_8$ is $C_1C_{12}$alkyl, $C_3$–$C_{18}$alkenyl; $C_3$–$C_{20}$alkyl which is interrupted by O and/or substituted by OH, or $C_1$–$C_4$alkyl which is substituted by —$P(O)(OR_{14})_2$, $R_9$ and $R_{10}$ are each independently of the other $C_1$–$C_8$alkyl or cyclohexyl, or $R_9$ and $R_{10}$ together are pentamethylene or 3-oxapentamethylene, $R_{11}$ is $C_1$–$C_8$alkyl, $C_2$–$C_5$alkenyl or phenyl, and $R_{14}$ is $C_1$–$C_4$alkyl, and $R_{19}$ and $R_{20}$ are each independently of the other H, OH, $C_1$–$C_8$alkyl, $C_1$–$C_8$alkoxy or halogen.

Particularly preferred compounds of formula I or II are those, wherein n is 1 or 2, $R_1$ and $R_2$ are each independently of the other H or $CH_3$, $R_3$ and $R_4$ are each independently of the other H, $CH_3$ or Cl, $R_5$ and $R_6$ are hydrogen, $R_7$, if n is 1, is hydrogen, $C_1$–$C_{12}$alkyl; $C_1$–$C_4$alkyl, glycidyl or benzyl which is substituted by OH, $C_4$–$C_{18}$alkoxy, —$COOR_8$, —$CON(R_9)(R_{10})$ and/or —$OCOR_{11}$ and, if n is 2, is $C_6$–$C_{12}$alkylene, 2-butenylene, 1,4-xylylene, or $C_3$–$C_{20}$alkylene which is interrupted by O and/or substituted by OH, $R_8$ is $C_4$–$C_{12}$alkyl, $C_{12}$–$C_{18}$alkenyl; $C_6$–$C_{20}$alkyl which is interrupted by and/or substituted OH, or $C_1$–$C_4$alkyl which is substituted by —$P(O)(OR_{14})_2$, $R_9$ and $R_{10}$ are $C_4$–$C_8$alkyl, $R_{11}$ is $C_1$–$C_8$alkyl or $C_2$–$C_3$alkenyl, and $R_{14}$ is $C_1$–$C_4$alkyl, and $R_{19}$ and $R_{20}$ are each independently of the other H, $C_1$–$C_4$alkyl or $C_1$–$C_4$alkoxy.

Particularly preferred compounds of formula I or II are those, wherein n is 1 or 2, and $R_7$, if n is 1, is a group —$CH_2CH(OH)CH_2O$—$R_{21}$, wherein $R_{21}$ is $C_1$–$C_{12}$alkyl, phenyl; phenyl or $C_3$–$C_5$alkenoyl which is substituted by $C_1$–$C_{12}$alkyl, $C_1$–$C_{12}$alkoxy or halogen, and, if n is 2, $R_7$ is a group —$CH_2CH(OH)CH_2O$—$R_{15}$—$OCH_2CH(OH)CH_2$—, wherein $R_{15}$ has the meaning cited in claim 4.

Examples of individual compounds of formula I are the following

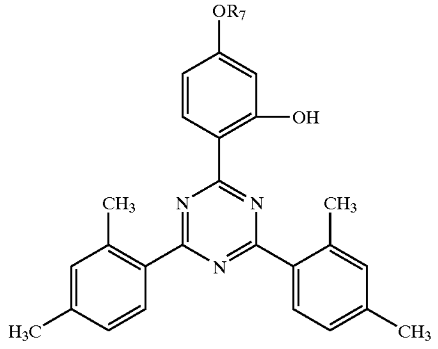

$R_7$=

—H

—$C_2H_5$

—$C_4H_9$

—$C_8H_{17}$

—$C_{12}H_{25}$

—$C_{18}H_{37}$

-cyclohexyl

—$CH_2$ phenyl

—$CH_2CH_2OH$

—$CH_2CH_2OCOCH_3$

—$CH_2CH_2OCOCH{=}CH_2$

—$CH_2CH(OH)C_8H_{17}$

—$CH_2CH(OH)C_{12}H_{25}$

—$CH_2CH(OH)CH_2OC_8H_{17}$

—$CH_2CH(OH)CH_2O$phenyl

—$CH_2CH(OH)CH_2OCOC(CH_3){=}CH_2$

—$CH_2COOH$

—$CH_2CH_2COOC_4H_9$

—$CH_2COOC_8H_{17}$

—$CH_2COO(CH_2CH_2O)_7H$

—$CH_2COOCH_2CH(OH)CH_2OC_4H_9$

—$CH_2COOCH_2CH(CH_3)OCH_2CH(CH_3)OCH(CH_3)CH_3$

—$CH_2COOCH_2P(O)(OC_2H_5)_2$

—$CH_2COOCH_2CH(OH)CH_2P(O)(OC_4H_9)_2$

—$CH_2COO(CH_2)_7CH{=}CHC_8H_{17}$

—$CH_2COOCH_2CH_2OCH_2CH_2OC_6H_{13}$

—$CH_2CON(C_2H_5)_2$

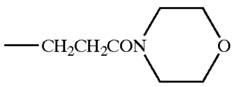

—$CH_2CONHCH_2CH_2CH_2N(CH_3)_2$

—$CH_2CONHC_8H_{17}$

—$CH_2CON(C_8H_{17})_2$.

Other compounds are:

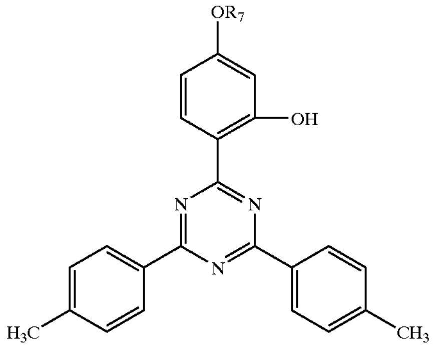

$R_7$=

—$C_4H_9$

—$C_8H_{17}$

—$C_{12}H_{25}$

—$CH_2CH(OH)CH_2OC_8H_{17}$

—$CH_2COOC_2H_5$

—$CH_2COOCH_2O\ CH_3$

—$CH_2COOCH_2CH{=}CH$-phenyl

—$CH_2COOCH_2CH(OH)CH_2OC_8H_{17}$

—$CH_2$phenyl

—$CH_2CH{=}CH_2$

—$CH_2CON(C_4H_9)_2$

—$CH_2CH_2CONH_8H_{17}$

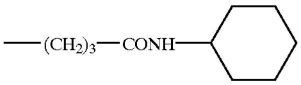

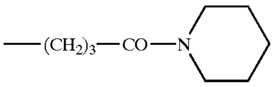

—$CO$—$OC_6H_{13}$

—$CH_2CH_2Cl$

—$CH_2CH_2CN$ and the compounds

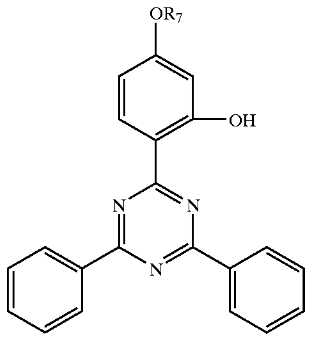

$R_7$=

—H

—$CH_3$

—$C_3H_7$

—$C_6H_{13}$

—$C_8H_{17}$

—$C_{12}H_{25}$

—$CH_2CH(OH)CH_2OC_8H_{17}$

—$CH_2CH(OH)$phenyl

—$CH_2CH(OH)CH_2OCO$phenyl $—CH_2CH(CH_3)OCOCH_3$ $—SO_2—C_{12}H_{15}$

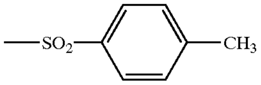

$—CH_2COOC_{10}H_{21}$ $—CH_2CONHCH_2CH_2OCH_3$ $—CH_2CH_2CONHCH_2phenyl$ $—(CH_2)_3CONH(CH_2)_3N(C_2H_5)_2$ $—CH_2CONHC_{12}H_{25}$.

Further suitable compounds are:

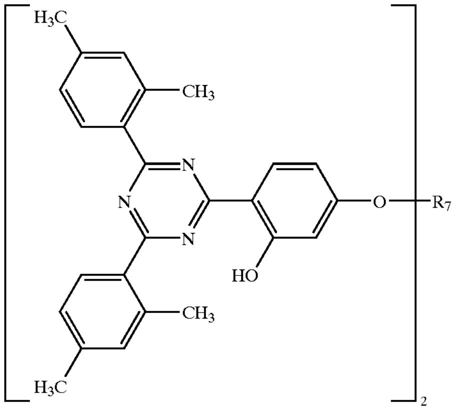

$R_7$=

$—CH_2CH(OH)CH_2—$

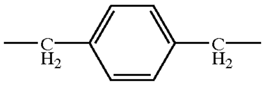

$—CH_2—CH{=}CH—CH_2—$ $—(CH_2)_4—$ $—(CH_2)_6—$ $—(CH_2)_8$ $—(CH_2)_{12}—$ $—CH_2CH(OH)CH_2O—CH_2CH_2—OCH_2CH(OH)CH_2—$ $—CH_2CH(OH)CH_2O—(CH_2)_6—OCH_2CH(OH)CH_2—$

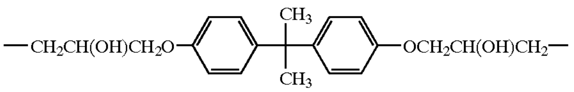

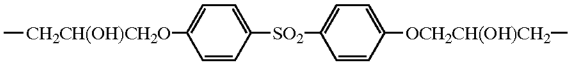

$—CH_2COO—(CH_2)_6—OCOCH_2$

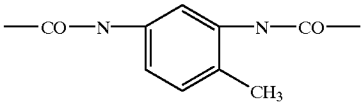

$—CO—(CH_2)_8—CO—$;

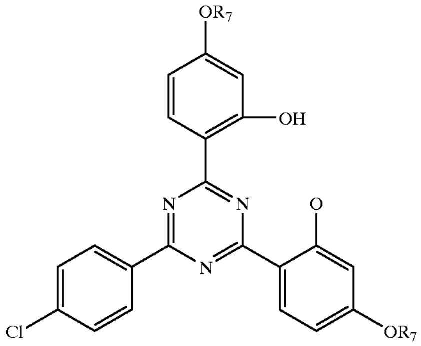

$R_7$=

$—H$ $—C_4H_9$ $—C_8H_{17}$ $—C_{18}H_{37}$ $—CH_2CH(OH)CH_3$ $—CH_2CH_2OC_4H_9$ $—CH_2CH_2COC_2H_5$ $—CH_2COOC_8H_{17}$ $—CH_2CH(OH)CH_2OC_4H_9$ $—CH_2CH(OH)CH_2Ophenyl$;

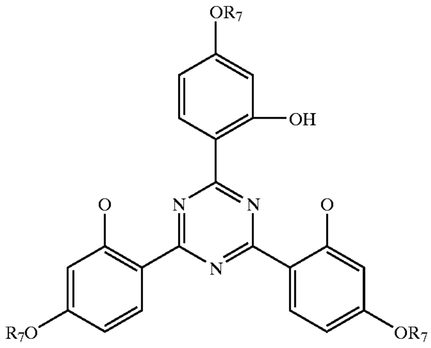

$R_7$=

$—C_2H_5$ $—C_4H_9$ $—C_6H_{13}$ $—C_8H_{17}$ $—CH_2CH_2OH$ $—CH_2CH_2Ophenyl$ $—CH_2COOC_6H_{13}$ $—CH_2CH_2COO(CH_2CH_2O)_3H$ $—CH_2CH(OH)CH_2OC_6H_{13}$ $—CH_2CH(OH)CH_2phenyl$.

Another preferred form of the process is that wherein a dye or coloured pigment is evaporated simultaneously or successively with the UV absorber while being exposed to a plasma, pigment and UV absorber being allowed to deposit on the substrate.

Suitable pigments or dyes are those which can be evaporated without degradation under the plasma conditions. They are commercially available and their suitability can be easily tested.

Another preferred process is that which comprises evaporating a mono- or polyolefinically unsaturated compound simultaneously with the UV absorber while exposing it to the plasma and allowing it to deposit on the substrate.

The unsaturated compounds can contain one or more than one olefinic double bond. They can be low-molecular (monomeric) or higher-molecular (oligomeric). Examples of monomers containing a double bond are alkylacrylates or alkylmethacrylates, or hydroxyalkylacrylates or hydroxyalkylmethacrylates, for example methyl acrylate, ethyl acrylate, butyl acrylate, 2-ethylhexyl acrylate or 2-hydroxyethyl acrylate, isobornyl acrylate, methyl methacrylate or ethyl methacrylate. Silicone acrylates are also interesting. Other examples are acrylonitrile, acrylamide, methacrylamide, N-substituted (meth)acrylamide, vinyl esters, such as vinyl acetate, vinyl ethers, such as isobutylvinyl ether, styrene, alkyl styrene and halostyrene, N-vinylpyrrolidone, vinyl chloride or vinylidene chloride.

Examples of monomers containing several double bonds are ethylene glycol diacrylate, propylene glycol diacrylate, neopentyl glycol diacrylate, hexamethylene glycol diacrylate or bisphenol A diacrylate, 4,4'-bis(2-acryloyloxyethoxy)diphenylpropane, trimethylolpropanetricrylate, pentaerythritol triacrylate or pentaerythritol tetraacrylate, vinyl acrylate, divinyl benzene, divinyl succinate, diallylphthalate, triallylphosphate, triallylisocyanurate, tris(hydroxyethyl) isocyanuratetriacrylate or tris(2-acryloylethyl)isocyanurate.

Examples of high molecular weight (oligomeric) polyunsaturated compounds are acrylated epoxy resins, polyesters, polyurethanes and polyethers which contain acrylated groups or vinyl ether or epoxy groups. Other examples of unsaturated oligomers are unsaturated polyester resins which are usually prepared from maleic acid, phthalic acid and one or several diols and which usually have molecular weights in the range from about 500 to 3000. Apart from these, it is also possible to use vinyl ether monomers and oligomers and maleate-terminated oligomers containing polyester, polyurethane, polyether, polyvinyl ether and epoxy main chains. Particularly suitable are combinations of vinyl ether group-carrying oligomers and polymers such as those described in WO 90/01512. Copolymers of monomers functionalised with vinyl ether and maleic acid are also suitable. Such unsaturated oligomers can also be called prepolymers.

Particularly suitable compounds are, for example, esters of ethylenically unsaturated carboxylic acids and polyols or polyepoxides, and polymers containing ethylenically unsaturated groups in the chain or in side groups, for example unsaturated polyesters, polyamides and polyurethanes and copolymers thereof, alkyd resins, polybutadiene and butadiene copolymers, polyisoprene and isoprene copolymers, polymers and copolymers containing (meth)acrylic groups in side chains, and mixtures of one or several of such polymers.

Examples of unsaturated carboxylic acids are acrylic acid, methacrylic acid, crotonic acid, itaconic acid, cinnamic acid, unsaturated fatty acids such as linoleic acid or oleic acid. Acrylic and methacrylic acid are preferred.

Suitable polyols are aromatic and, in particular, aliphatic and cycloaliphatic polyols. Examples of aromatic polyols are hydroquinone, 4,4'-dihydroxydiphenyl, 2,2-di(4-hydroxyphenyl)-propane and also novolaks and resols. Examples of polyepoxides are those based on the cited polyols, in particular on the aromatic polyols and epichlorohydrin. Other suitable polyols are polymers and copolymers containing hydroxyl groups in the polymer chain or in side groups, for example polyvinyl alcohol and copolymers thereof or hydroxyalkyl polymethacrylate or copolymers thereof. Other suitable polyols are oligoesters containing hydroxyl terminal groups.

Examples of aliphatic and cycloaliphatic polyols are alkylenediols containing preferably 2 to 12 carbon atoms, such as ethylene glycol, 1,2- or 1,3-propanediol, 1,2-, 1,3- or 1,4-butanediol, pentanediol, hexanediol, octanediol, dodecanediol, diethylene glycol, triethylene glycol, polyethylene glycols having molecular weights in the range of preferably 200 to 1500, 1,3-cyclopentanediol, 1,2-, 1,3- or 1,4-cyclohexanediol, 1,4-dihydroxymethylcyclohexane, glycerol, tris(β-hydroxyethyl)amine, trimethylolethane, trimethylolpropane, pentaerythritol, dipentaerythritol and sorbitol.

The polyols can be partially or completely esterified with one or different unsaturated carboxylic acids, it being possible for the free hydroxyl groups in partial esters to be modified, e.g. etherified, or esterified with other carboxylic acids.

Examples of esters are: trimethylolpropanetriacrylate, trimethylolethanetriacrylate, trimethylolpropanetrimethacrylate, trimethylolethanetrimethacrylate, tetramethylene glycol dimethacrylate, triethylene glycol dimethacrylate, tetraethylene glycol diacrylate, pentaerythritol diacrylate, pentaerythritol triacrylate, pentaerythritol tetraacrylate, dipentaerythritol diacrylate, dipentaerythritol triacrylate, dipentaerythritol tetraacrylate, dipentaerythritol pentaacrylate, dipentaerythritol hexaacrylate, tripentaerythritol octaacrylate, pentaerythritol dimethacrylate, pentaerythritol trimethacrylate, dipentaerythritol dimethacrylate, dipentaerythritol tetramethacrylate, tripentaerythritol octamethacrylate, pentaerythritol diitaconate, dipentaerythritol trisitaconate, dipentaerythritol pentaitaconate, dipentaerythritol hexaitaconate, ethylene glycol diacrylate, 1,3-butanedioldiacrylate, 1,3-butanedioldimethacrylate, 1,4-butanedioldiitaconate, sorbitol triacrylate, sorbitol tetraacrylate, pentaerythritol-modified-triacrylate, sorbitol tetramethacrylate, sorbitol pentaacrylate, sorbitol hexaacrylate, oligoester acrylates and oligoester methacrylates, glycerol-indi- and -triacrylate, 1,4-cyclohexanediacrylate, bisacrylates and bismethacrylates of polyethylene glycol having a molecular weight in the range of 200 to 1500, or mixtures thereof.

Other suitable components are also the amides of identical or different unsaturated carboxylic acids of aromatic, cycloaliphatic and aliphatic polyamines containing preferably 2 to 6, particularly preferably 2 to 4, amino groups. Examples of such polyamines are ethylenediamine, 1,2- or 1,3-propylenediamine, 1,2-, 1,3- or 1,4-butylenediamine, 1,5-pentylenediamine, 1,6-hexylenediamine, octylenediamine, dodecylenediamine, 1,4-diaminocyclohexane, isophoronediamine, phenylenediamine, bisphenylenediamine, di-β-aminoethyl ether, diethylenetriamine, triethylenetetramine, di(β-aminoethoxy)- or di(β-aminopropoxy)ethane. Other suitable polyamines are polymers and copolymers containing, where required, additional amino groups in the side chain, and oligoamides containing amino terminal groups. Examples of such unsaturated amides are: methylenebisacrylamide, 1,6-hexamethylenebisacryle-amide, diethylenetriamine-tris-methacrylamide, bis(methacrylamidopropoxy)ethane, β-meth-crylamidoethylmethacrylate, N[(β-hydroxyethoxy)ethyl]acrylamide.

Suitable unsaturated polyesters and polyamides are derived, for example, from maleic acid and diols or diamines. The maleic acid can be replaced partially or completely by other dicarboxylic acids. They can be used together with the ethylenically unsaturated comonomers, e.g. styrene. The polyesters and polyamides can also be derived from dicarboxylic acids and ethylenically unsaturated diols or diamines, in particular from long-chain ones containing e.g. 6 to 20 carbon atoms. Examples of polyurethanes are those which are composed of saturated or unsaturated diisocyanates and unsaturated or saturated diols.

Polybutadiene and polyisoprene and copolymers thereof are known. Suitable comonomers are, for example, olefins such as ethylene, propene, butene, hexene, (meth)acrylates, acrylonitriles, styrenes or vinyl chloride. Polymers containing (meth)acrylate group in the side chain are also known.

These may be, for example, reaction products of epoxy resins based on novolak with (meth)acrylic acid, homo- or copolymers of vinyl alcohol or their hydroxyalkyl derivatives which are esterified with (meth)acrylic acid, or homo- and copolymers of (meth)-acrylates which are esterified with hydroxyalkyl(meth)acrylates.

The mono- or polyolefinically unsaturated compound is particularly preferably an acrylate compound or a methacrylate compound.

It is very particularly preferred to use polyunsaturated acrylate compounds such as those listed above.

The process can also be carried out such that the UV absorber is evaporated together with the pigment and an olefinically unsaturated compound.

Many possibilities have been described in the literature for obtaining plasmas under vacuum conditions. The electrical energy can be coupled in inductively or capacitively. The electrical energy may be direct current or alternating current and the frequency of the latter can vary from few kHz up to the megahertz range. Feeding in in the microwave range (gigahertz) is also possible.

Primary plasma gases may be, for example, helium, argon, xenone, $N_2$, $O_2$ or air, non-reactive gases such as helium, argon or xenone being preferred. When the UV absorber is being evaporated it mixes with the plasma gas and is likewise ionised.

The novel process is per se not susceptible to gas being added and the electrical energy being coupled in. It is crucial that work is carried out at a relatively low pressure.

The pressure is preferably in the range from $10^{-6}$ mbar to $10^{-2}$ mbar, particularly preferably from $10^{-3}$ to $10^{-4}$ mbar.

The material can be applied, for example, to a plasma electrode and can be evaporated directly from there. However, the material to be evaporated is preferably on a plate which can be heated separately or on a crucible which is located outside of the plasma discharge. Crucible or plate can lie on a positive or negative electrical potential compared to the plasma.

JP 6-25448, for example, cites suitable embodiments of the process for the production of the plasma and for the deposition.

The temperature at which the UV absorber is evaporated is preferably in the range from 20° C. to 350° C., particularly preferably from 100° C. to 250° C.

The process is preferably carried out by the Valico process of Rowo Coating, described in WO 96/15544.

The process is particularly suitable for depositing thin coatings. The deposited coating preferably has a thickness from 10 nm to 1000 nm, particularly preferably from 50 nm to 500 nm and, very particularly preferably, from 100 nm to 300 nm.

This invention also relates to the use of a UV absorber of the hydroxyphenyl-s-triazine class for the preparation of UV absorbant layers in a plasma-enhanced vacuum deposition and to coated substrates which can be prepared by the process of this invention.

The following Examples illustrate the invention in more detail.

To carry out the plasma-enhanced depositions, a laboratory apparatus of ROWO Coating, Herbolzheim, was used which functions via the so-called VALICO process (anodic arc, WO 96/15544).

About 20–25 g of the material to be evaporated are placed in a molybdenum crucible in an electrical evaporation unit. The system is then evacuated to about $1\times10^{-4}$ mbar. After heating up the thermal evaporator, a constant system pressure of about $2–3\times10^{-4}$ mbar is adjusted via a control valve. The arc is then ignited and the deposition is carried out. The distance between evaporation crucible and substrate is 50 cm.

The coating thickness is determined via AFM (atomic force microscopy, edge measurement).

The transmission is measured using a spectral photometer Shimadsu UV-2102/3102 PC.

To estimate the adhesive strength a simple tape test is carried out using Tesa® adhesive film at a peel off angle of about 60°.

EXAMPLE 1

Plasma-enhanced Deposition of a UV Protective Coating by Evaporation of a Triazine Having a Low Extinction Coefficient (Tinuvin 1577)

| | |
|---|---|
| UV absorber | Tinuvin ® 1577 |
| substrate | polycarbonate |
| system pressure | $3 \times 10^{-4}$ mbar |
| capacity evaporator [W] | 150 |
| arc current [A] | 20 |
| potential difference [V] | 100 |
| duration [s] | 180 |
| coating aspect | transparent, colourless |
| coating thickness [nm] | 320 |
| transmission (380 nm) [%] | 15 |
| adhesion | coating removed |

Comparison Example A

Purely Thermal Deposition of a UV Protective Coating by Evaporation of a Triazine Having a Low Extinction Coefficient (Tinuvin 1577)

| | |
|---|---|
| UV absorber | Tinuvin ® 1577 |
| substrate | polycarbonate |
| system pressure | $3 \times 10^{-4}$ mbar |
| capacity evaporator [W] | 150 |
| arc current [A] | — |
| potential difference [V] | — |
| duration [s] | 90 |
| coating aspect | milky |
| coating thickness [nm] | about 2000 |
| transmission (380 nm) [%] | 2 |
| adhesion | coating removed |

EXAMPLE 2

Plasma-enhanced Deposition of a UV Protective Coating by Evaporation of a Triazine Having a High Extinction Coefficient

| | |
|---|---|
| UV absorber | UVA-1 |
| substrate | polycarbonate |
| system pressure | $3 \times 10^{-4}$ mbar |
| capacity evaporator [W] | 132 |
| arc current [A] | 100 |
| potential difference [V] | 12 |
| duration [s] | 300 |
| coating aspect | transparent, colourless |
| coating thickness [nm] | 420 |
| transmission (380 nm) [%] | 2 |
| adhesion | coating removed |

EXAMPLE 3

Plasma-enhanced Deposition of an Adhesion Resistant UV Protective Coating by Co-evaporation of a Triazine Having a High Extinction Coefficient and of a Triacrylate

| | |
|---|---|
| UV absorber | UVA-1 |
| acrylate | tris(hydroxyethyl)isocyanurate triacrylate |
| substrate | polycarbonate |
| system pressure | 3 × $10^{-4}$ mbar |
| capacity evaporator [W] | 132 |
| arc current [A] | 100 |
| potential difference [V] | 12 |
| duration [s] | 300 |
| coating aspect | transparent, colourless |
| coating thickness [nm] | 500 |
| transmission (380 nm) [%] | 5 |
| adhesion | coating not removed |

EXAMPLE 4

Plasma-enhanced Deposition of an Adhesive UV Protective Coating by Evaporation of an Acrylate-functionalised Triazine

| | |
|---|---|
| UV absorber | UVA-2 |
| substrate | polycarbonate |
| system pressure | 3 × $10^{-4}$ mbar |
| capacity evaporator [W] | 95 |
| arc current [A] | 50 |
| potential difference [V] | 5 |
| duration [s] | 480 |
| coating aspect | transparent colourless |
| coating thickness [nm] | 400 |
| transmission (380 nm) [%] | 20 |
| adhesion | coating not removed |

Comparison Example B

Thermal Deposition of a (Non-)adhesive UV Protective Coating by Evaporation of an Acrylate-functionalised Triazine

| | |
|---|---|
| light stabiliser | CG29-0191 |
| substrate | polycarbonate |
| system pressure | 3 × $10^{-4}$ mbar |
| capacity evaporator [W] | 95 |
| arc current [A] | — |
| potential difference [V] | — |
| duration [s] | 480 |
| coating aspect | milky, colourless |
| coating thickness [nm] | 600 |
| transmission (380 nm) [%] | 10 |
| adhesion | coating completely removed |

EXAMPLE 5

Plasma-enhanced Deposition of an Adhesive, Coloured UV Protective Coating by Evaporation of a Triazine Having a High Extinction Coefficient Together with an Acrylate and a Pigment

| | |
|---|---|
| UV absorber | UVA-1 |
| acrylate | tris(hydroxyethyl)isocyanurate triacrylate, |
| pigment | Iragzin ® DPP Rot BO |
| substrate | polycarbonate |

-continued

| | |
|---|---|
| system pressure | 3 × $10^{-4}$ mbar |
| capacity evaporator [W] | 95 |
| arc current [A] | 50 |
| potential difference [V] | 5 |
| duration [s] | 420 |
| coating aspect | transparent, red |
| coating thickness [nm] | 300 |
| transmission (380 nm) [%] | 15 |
| adhesion | coating not removed |

Comparison Example C

Thermal Deposition of a (Non-)adhesive, Coloured UV Protective Coating by Evaporation of a Triazine Having a High Extinction Coefficient Together with an Acrylate and a Pigment

| | |
|---|---|
| UV absorber | UVA-1<br>tris(hydroxyethyl)isocyanuratriacrylate,<br>Iragzin DPP Rot BO |
| substrate | polycarbonate |
| system pressure | 3 × $10^{-4}$ mbar |
| capacity evaporator [W] | 95 |
| arc current [A] | — |
| potential difference [V] | — |
| duration [s] | 420 |
| coating aspect | milky, red |
| coating thickness [nm] | 400 |
| transmission (380 nm) [%] | 10 |
| adhesion | coating completely removed |

UVA-1

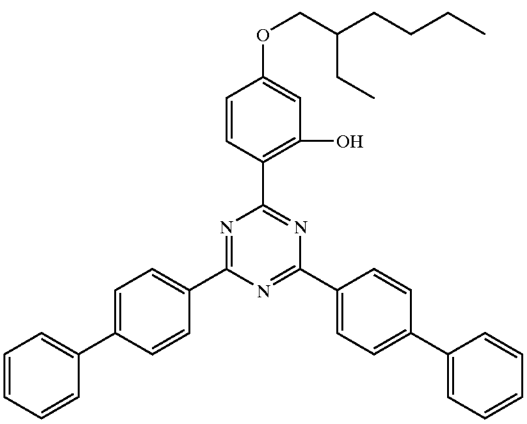

Tinuvin 1577

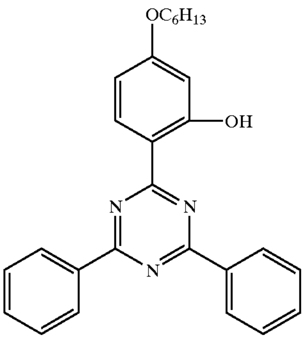

UVA-2

-continued

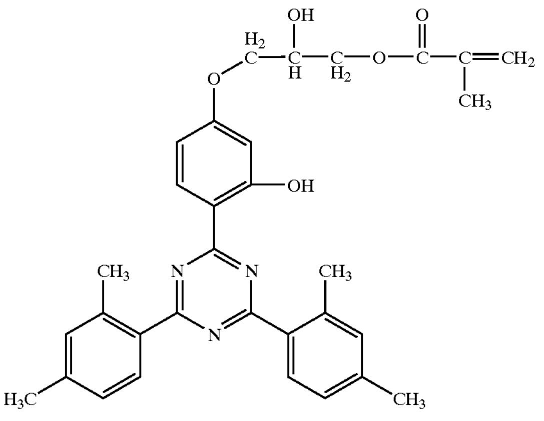

What is claimed is:

1. A process for the preparation of a continuous UV absorbant coating on organic or inorganic substrates via plasma-enhanced vacuum deposition, which process comprises evaporating a UV absorber of the hydroxyphenyl-s-triazine class under vacuum while exposing it to a plasma and allowing it to deposit on a substrate.

2. A process according to claim 1, wherein the substrate used is a metal, a semiconductor, glass, quartz or a thermoplastic crosslinked or structurally crosslinked plastic material.

3. A process according to claim 2, wherein the thermoplastic crosslinked or structurally crosslinked plastic material is polyolefin, polyamide, polyacrylate, polycarbonate, polystyrene, an acryl/melamine, alkyd or polyurethane paint system.

4. A process according to claim 1, wherein the UV absorber of the hydroxyphenyl-s-triazine class is a compound of formula I or II (I)

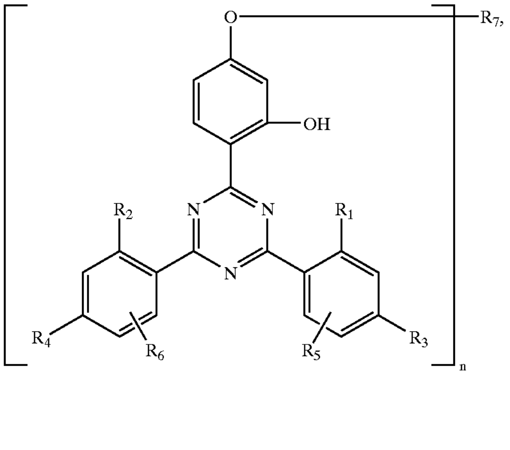

-continued (II)

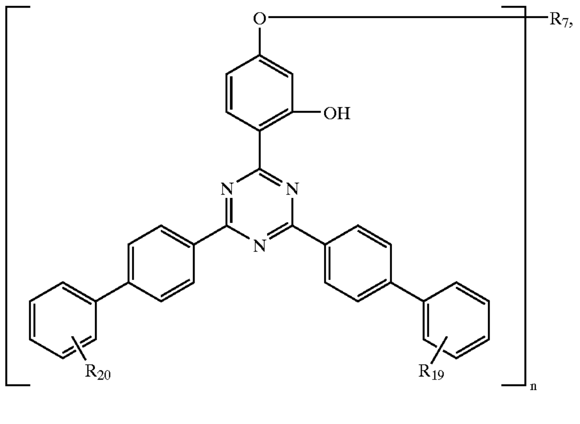

wherein n is 1 or 2, $R_1$ and $R_2$ are each independently of the other H, OH, $C_1$–$C_{12}$alkyl or halomethyl, $R_3$ and $R_4$ are each independently of the other H, OH, $C_1$–$C_{12}$alkyl, $C_1$–$C_{18}$alkoxy or halogen and, in the case of n=1, can also be a radical —$OR_7$, $R_5$ and $R_6$ are each independently of the other H, $C_1$–$C_{12}$alkyl or halogen, $R_7$, if n is 1, is hydrogen, $C_1$–$C_{18}$alkyl, or $C_1$–$C_{12}$alkyl which is substituted by OH, $C_1$–$C_{18}$alkoxy, halogen, phenoxy,or by phenoxy which is substituted by $C_1$–$C_{18}$alkyl, $C_1$–$C_{18}$alkoxy or halogen; or by —COOH, —$COOR_8$, —$CONH_2$, —$CONHR_9$, —$CON(R_9)(R_{10})$, —$NH_2$, —$NHR_9$, —$N(R_9)(R_{10})$, —$NHCOR_{11}$, —CN and/or —$OCOR_{11}$, or $R_7$ is $C_4$–$C_{20}$alkyl, $C_3$–$C_6$alkenyl, glycidyl, $C_5$–$C_8$cycloalkyl, each of which is interrupted by one or several O and substituted by OH or $C_1$–$C_{12}$alkoxy; cyclohexyl which is substituted by OH, $C_1$–$C_4$alkyl or —$OCOR_{11}$; $C_7$–$C_{11}$phenylalkyl, —CO—$R_{12}$ or —$SO_2$—$R_{13}$, each of which is unsubstituted or substituted by OH, Cl or $CH_3$ and, if n is 2, is $C_2$–$C_{16}$alkylene, $C_4$–$C_{12}$alkenylene, xylylene; $C_3$–$C_{20}$alkylene which is interrupted by one or several O and/or substituted by OH; a group —$CH_2CH(OH)CH_2O$—$R_{15}$—$OCH_2CH(OH)CH_2$—, —CO—$R_{16}$—CO—, —CO—NH—$R_{17}$—NH—CO— or —$(CH_2)_m$—COO—$R_{18}$—OCO—$(CH_2)_m$—, wherein m is 1–3, $R_8$ is $C_1$–$C_{18}$alkyl, $C_3$–$C_{18}$alkenyl; $C_3$–$C_{20}$alkyl which is interrupted by O, N or S and/or substituted by OH; $C_1$–$C_4$alkyl, glycidyl, cyclohexyl or $C_7$–$C_{11}$phenylalkyl, each of which is substituted by —$P(O)(OR_{14})_2$, —$N(R_9)(R_{10})$ or —$OCOR_{11}$ and/or OH, $R_9$ and $R_{10}$ are each independently of the other $C_1$–$C_{12}$alkyl, $C_3$–$C_{12}$alkoxyalkyl, $C_4$–$C_{16}$dialkylaminoalkyl or $C_5$–$C_{12}$cycloalkyl, or $R_9$ and $R_{10}$ together are $C_3$–$C_9$alkylene or $C_3$–$C_9$oxaalkylene or $C_3$–$C_9$azaalkylene, $R_{11}$ is $C_1$–$C_{18}$alkyl, $C_2$–$C_{18}$alkenyl or phenyl, $R_{12}$ is $C_1$–$C_{18}$alkyl, $C_2$–$C_{18}$alkenyl, phenyl, $C_1$–$C_{12}$alkoxy, phenoxy, $C_1$–$C_{12}$alkylamino, phenylamino, tolylamino or naphthylamino, $R_{13}$ is $C_1$–$C_{12}$alkyl, phenyl, naphthyl or $C_7$–$C_{14}$alkylphenyl, $R_{14}$ is $C_1$–$C_{12}$alkyl or phenyl, $R_{15}$ is $C_2$–$C_{10}$alkylene, phenylene or a group -phenylene-X-phenylene-, wherein X is —O—, —S—, —$SO_2$—, —$CH_2$— or —$C(CH_3)_2$—, $R_{16}$ is $C_2$–$C_{10}$alkylene, $C_2$–$C_{10}$oxaalkylene or $C_2$–$C_{10}$thiaalkylene, phenylene, naphthylene, diphenylene or $C_2$–$C_6$alkenylene, $R_{17}$ is $C_2$–$C_{10}$alkylene, phenylene, naphthylene, methylenediphenylene or $C_7$–$C_{15}$alkylphenylene, $R_{18}$ is $C_2$–$C_{10}$alkylene or $C_4$–$C_{20}$alkylene which is interrupted by O, and $R_{19}$ and $R_{20}$ are each independently of the other H, OH, $C_1$–$C_{12}$alkyl, $C_1$–$C_{12}$alkoxy, $NH_2$, $NHR_9$, $NR_9R_{10}$ or halogen.

5. A process according to claim 4, wherein in the compound of formula I or II n is 1 or 2, $R_1$ and $R_2$ are each independently of the other H, OH or $C_1$–$C_4$alkyl, $R_3$ and $R_4$ are each independently of the other H, OH, $C_1$–$C_4$alkyl, $C_1$–$C_4$alkoxy, halogen or a radical —$OR_7$, $R_5$ and $R_6$ are each independently of the other H or $C_1$–$C_4$alkyl, $R_7$, if n is 1, is hydrogen, $C_1$–$C_{18}$alkyl; $C_1$–$C_6$alkyl, allyl, glycidyl or benzyl, each of which is substituted by OH, $C_1$–$C_{18}$alkoxy, phenoxy, —$COOR_8$, —$CONHR_9$, —$CON(R_9)(R_{10})$ and/or —$OCOR_{11}$, and if n is 2, is $C_4$–$C_{12}$alkylene, $C_4$–$C_6$alkenylene, xylylene, or $C_3$–$C_{20}$alkylene which is interrupted by one of several O and/or substituted by OH, $R_8$ is $C_1$–$C_{12}$alkyl, $C_3$–$C_{18}$alkenyl; $C_3$–$C_{20}$alkyl which is interrupted by O and/or substituted by OH, or $C_1$–$C_4$alkyl which is substituted by —$P(O)(OR_{14})_2$, $R_9$ and $R_{10}$ are each independently of the other $C_1$–$C_8$alkyl or cyclohexyl, or $R_9$ and $R_{10}$ together are pentamethylene or 3-oxapentamethylene, $R_{11}$ is $C_1$–$C_8$alkyl, $C_2$–$C_5$alkenyl or phenyl, and $R_{14}$ is $C_1$–$C_4$alkyl, and $R_{19}$ and $R_{20}$ are each independently of the other H, OH, $C_1$–$C_8$alkyl, $C_1$–$C_8$alkoxy or halogen.

6. A process according to claim 4, wherein in the compound of formula I or II n is 1 or 2, $R_1$ and $R_2$ are each independently of the other H or $CH_3$, $R_3$ and $R_4$ are each independently of the other H, $CH_3$ or Cl, $R_5$ and $R_6$ are hydrogen, $R_7$, if n is 1, is hydrogen, $C_1$–$C_{12}$alkyl; $C_1$–$C_4$alkyl, glycidyl or benzyl, each of which is substituted by OH, $C_4$–$C_{18}$alkoxy, —$COOR_8$, —$CON(R_9)(R_{10})$ and/or —$OCOR_{11}$, and, if n is 2, is $C_6$–$C_{12}$-alkylene, 2-butenylene, 1,4-xylylene, or $C_3$–$C_{20}$alkylene which is interrupted by O and/or substituted by OH, $R_8$ is $C_4$–$C_{12}$alkyl, $C_{12}$–$C_{18}$alkenyl; $C_6$–$C_{20}$alkyl which is interrupted by O and/or substituted OH, or $C_1$–$C_4$alkyl which is substituted by —$P(O)(OR_{14})_2$, $R_9$ and $R_{10}$ are $C_4$–$C_8$alkyl, $R_{11}$ is $C_1$–$C_8$alkyl or $C_2$–$C_3$alkenyl, and $R_{14}$ is $C_1$–$C_4$alkyl, and $R_{19}$ and $R_{20}$ are each independently of the other H, $C_1$–$C_4$alkyl or $C_1$–$C_4$alkoxy.

7. A process according to claim 4, wherein in the compound of formula I or II n is 1 or 2, and $R_7$, if n is 1, is a group —$CH_2CH(OH)CH_2O$—$R_{21}$, wherein $R_{21}$ is $C_1$–$C_{12}$alkyl, phenyl; phenyl or $C_3$–$C_5$alkenoyl, each of which is substituted by $C_1$–$C_{12}$alkyl, $C_1$–$C_{12}$alkoxy or halogen, and, if n is 2, $R_7$ is a group —$CH_2CH(OH)CH_2O$—$R_{15}$—$OCH_2CH(OH)CH_2$—, wherein $R_{15}$ has the meaning cited in claim 4.

8. A process according to claim 1, wherein the pressure is in the range from $10^{-6}$ mbar to $10^{-2}$ mbar.

9. A process according to claim 1, wherein the temperature at which the UV absorber is evaporated is in the range from 20° C. to 350° C.

10. A process according to claim 1, wherein the deposited coating has a thickness from 10 nm to 1000 nm.

11. A process according to claim 1, which comprises evaporating a dye or coloured pigment simultaneously or successively with the UV absorber while exposing it to a plasma and allowing it to deposit on the substrate.

12. A process according to claim 1, which comprises evaporating a mono- or polyolefinically unsaturated compound simultaneously with the UV absorber while exposing it to a plasma and allowing it to deposit on the substrate.

13. A process according to claim 12, wherein the mono- or polyolefinically unsaturated compound is an acrylate or methacrylate compound.

* * * * *